United States Patent
Updegraff et al.

(10) Patent No.: US 8,089,996 B2
(45) Date of Patent: Jan. 3, 2012

(54) LIGHT INTENSITY BOOST FOR SUBPIXEL ENHANCEMENT

(75) Inventors: Shawn Updegraff, Fairport, NY (US); William Wayman, Ontario, NY (US)

(73) Assignee: Xerox Corporation, Norwalk, CT (US)

(*) Notice: Subject to any disclaimer, the term of this patent is extended or adjusted under 35 U.S.C. 154(b) by 215 days.

(21) Appl. No.: 12/138,882

(22) Filed: Jun. 13, 2008

(65) Prior Publication Data
US 2009/0310636 A1   Dec. 17, 2009

(51) Int. Cl.
*H01S 3/00* (2006.01)

(52) U.S. Cl. ............ 372/38.02; 372/38.07; 372/29.014; 372/29.015; 372/29.01

(58) Field of Classification Search ............... 372/38.02, 372/38.07, 38.1, 29.014, 29.015, 29.01
See application file for complete search history.

(56) References Cited

U.S. PATENT DOCUMENTS

| | | | | |
|---|---|---|---|---|
| 5,043,745 A * | 8/1991 | Inoue et al. | ...................... | 347/246 |
| 5,715,067 A * | 2/1998 | Katori et al. | .................. | 358/3.02 |
| 5,808,770 A * | 9/1998 | Chen et al. | ...................... | 398/183 |
| 6,819,876 B2 * | 11/2004 | Okayasu et al. | ............... | 398/182 |
| 2003/0169455 A1* | 9/2003 | Takahashi et al. | ............ | 358/3.03 |
| 2004/0174916 A1* | 9/2004 | Chujo et al. | ............... | 372/38.02 |
| 2008/0056318 A1* | 3/2008 | Kubo | ......................... | 372/38.07 |

* cited by examiner

*Primary Examiner* — Kinam Park
(74) *Attorney, Agent, or Firm* — Oliff & Berridge, PLC

(57) ABSTRACT

Techniques are disclosed that enable fine features such as serifs and narrow strokes of texts to be produced by xerographic devices, for example. The fine features may be generated by subpixels which are produced when a pulse width used to image a pixel is shorter than a corresponding physical size of a laser beam spot used to write the image on a Xerographic photoreceptor. The laser driver may be modified to drive a light emitting element with a boost current profile that includes an overshoot above a steady state current at a rising edge. The overshoot results in a light intensity time profile that has an increased area for a subpixel.

19 Claims, 10 Drawing Sheets

LIGHT INTENSITY BOOST FOR SUBPIXEL ENHANCEMENT

BACKGROUND

Xerographic devices such as laser printers are common to the home and office. Increasing output quality of such devices is desirable.

SUMMARY

Techniques are disclosed that enable fine features such as serifs and narrow strokes of texts to be produced by xerographic devices, for example. The fine features may be generated by subpixels which are produced when a pulse width used to image a pixel is shorter than a corresponding physical size of a laser beam spot used to write the image on a Xerographic photoreceptor.

An electrostatic image is formed on an electrostatically charged photoreceptor when the laser beam spot selectively discharges the electrostatic charge. The amount of discharge is closely related to an integral over time of light intensity at a particular position of the photoreceptor.

When the laser beam is controlled to write a pixel, a pulse having a width that corresponds to a size of a pixel (e.g., the size of a laser spot) is applied to a laser driver, for example. During such a pixel write, the light intensity of the laser beam rises from a substantially zero intensity to a steady state intensity set based on requirements of electrostatic discharge characteristic of the photoreceptor. However, when a subpixel is to be written, a pulse width shorter than the corresponding size of the laser beam spot drives the laser driver, and the time integral of light intensity at a subpixel position may not reach a level for achieving sufficient electrostatic discharge, resulting is underdevelopment of subpixels.

The techniques disclosed herein produce more fully developed subpixels by increasing the time integral of light intensity during an initial light emission period of the laser beam. The increased light intensity may be provided by modifying the laser driver to boost the initial light intensity of the laser beam to achieve more acceptable subpixel development.

For example, the laser driver may be modified to drive a light emitting element with a boost current profile that includes an overshoot above a steady state current at a rising edge. The overshoot results in a light intensity time profile that has an increased area for a subpixel. The boost current profile may be obtained by modifying the driver circuit to provide initial high current transient behavior, additional current drivers used only during an initial light emitting period, and/or additional light emitting elements that are driven to emit light of greater intensity during the initial light emitting period, for example. In this way, the time integral of a subpixel is increased to a value consistent with fill pixel exposures.

EMBODIMENTS

Figure 1:
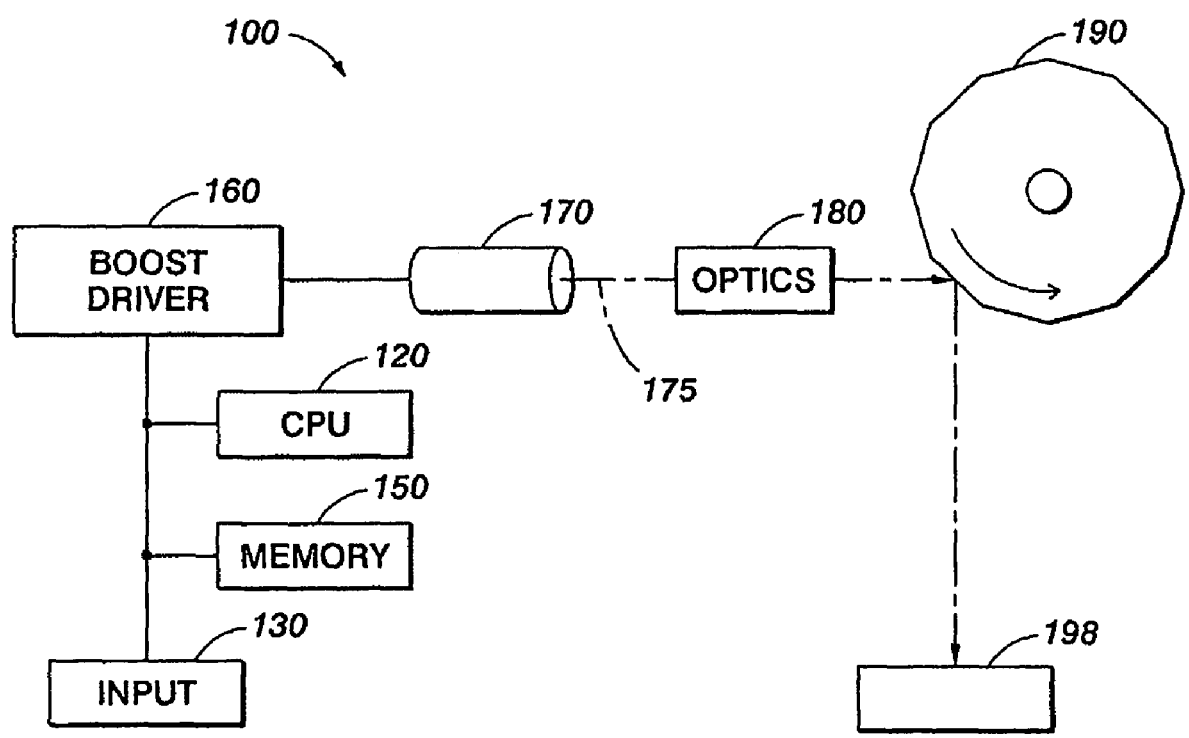
FIG. 1 shows an exemplary laser printing system.

FIG. 1 shows an exemplary laser printer system 100 that may include a CPU 120, an input 130, a memory 150, a driver 160, a light emitting device such as laser 170 that produces a laser beam 175, optics 180, a polygon mirror 190 and a photoreceptor 198. Although the components 120-160 of laser printer system 100 are shown connected via a bus architecture, other architectures may be used.

Input 130 may receive input data from a scanner of a photocopier, or an external memory source, such as a hard disk, for example. The input data may be stored in memory 150 for later processing or be immediately processed by CPU 120 to drive laser 170 via boost driver 160 that generates laser beam 175. Laser beam 175 is processed by optics 180, and scanned by polygon mirror 190 in a fast scan direction (horizontally across the page) to produce an image on photoreceptor 198.

Figure 2A:
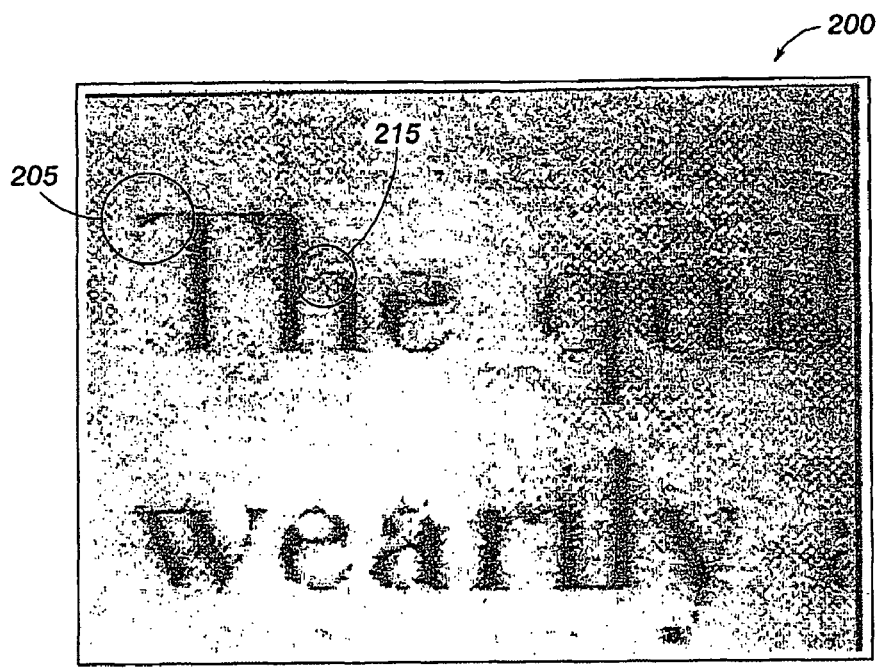
FIG. 2 shows exemplary laser printer images.
Figure 2B:
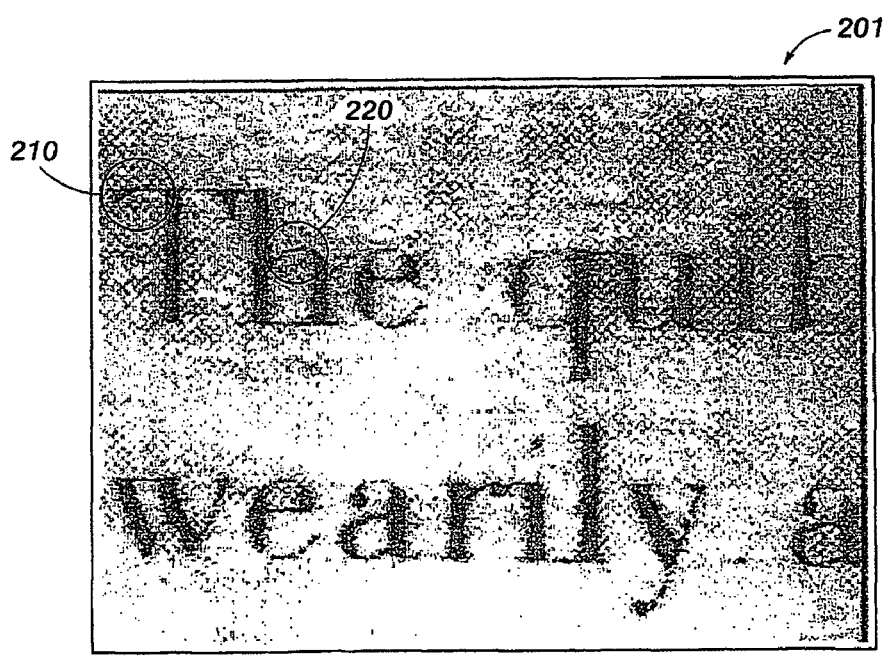

FIG. 2 shows contrasting printer output images 200 and 201. In image 200, serifs and fine strokes are not well formed producing less acceptable text. For example, a portion 205 of the "T" in "The" and a portion 215 of the curve in the "h" appear faint. In contrast, portions 210 and 220 of image 201 that corresponds to portions 205 and 215 are more acceptable because the intensity of laser beam 175 is increased using boost driver 160.

Text data may be produced by binary values (1s and 0s), where each bit may represent a value of a pixel. Printers may have print heads that include one or more laser sources such as laser diodes, for example. Laser diodes will be used as an example hereafter. These laser diodes may emit laser beam 175 onto a recording medium such as photoreceptor 198. After each pass, the recording medium may be moved in a slow scan direction (vertically) and the print head writes the next one or more horizontal lines based on additional binary values. In this way, a printed page of text may be produced.

Figure 3:
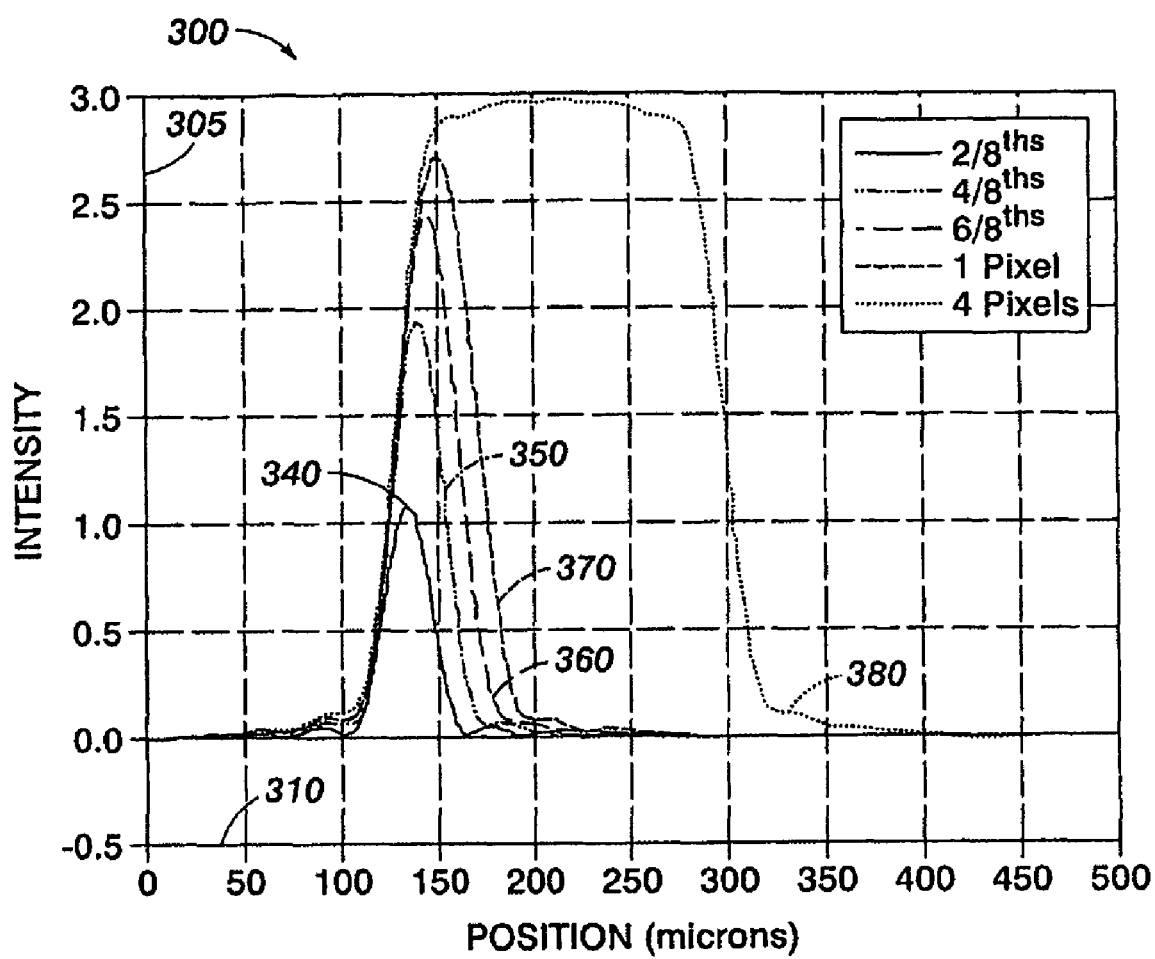
FIG. 3 shows exemplary dynamic spot profiles.

For a single laser diode print head, print data may be a string of bits corresponding to consecutive pixels. The pixels may be written to the recording medium by pulsing the laser diode for each pixel, thus forming a string of dots corresponding to a sequence of consecutive 1s, or the laser may remain on for the complete sequence of consecutive 1s forming a line having a length corresponding to the sequence of dots. Boost driver 160 may benefit either laser control technique. In the following discussion, the second laser control technique is used as an example. FIG. 3 shows an exemplary dynamic spot profile 300 that may correspond to image 200, for example. Dynamic spot profile 300 includes intensity axis 305 in ergs/cm$^2$, position axis 310 in microns (μ) along a scanning direction of the photoreceptor 198, $2/8^{th}$ pixel intensity curve 340, $4/8^{th}$ pixel intensity curve 350, $6/8^{th}$ pixel intensity curve 360, 1 pixel intensity curve 370 and 4 pixel intensity curve 380. FIG. 3 is an integrated profile, such that the total amount of light incident at any position X after the laser beam has passed is equal to the corresponding Y value of the curves.

The quality of development of subpixels may depend on the peak and cross section width of an intensity curve, such as intensity curves 340-380. Providing an intensity boost, as described below, may increase the peak of the intensity curve while also increasing the cross section width of the curve. Because the peak of the intensity curve is more conspicuous than the width of the curve, the following discussion refers to the peaks of curves, such as intensity curves 340-380, for ease of discussion.

As shown in FIG. 3, laser beam 175 reaches consecutively higher peak intensities as the size of the pixel portion to be written increases. For example, the peak intensity of intensity curve 340 is about 1.05 ergs/cm$^2$, the peak intensity of intensity curve 350 is about 1.9 ergs/cm$^2$, the peak intensity of intensity curve 360 is about 2.45 ergs/cm$^2$, the peak intensity of intensity curve 370 is about 2.7 ergs/cm$^2$, and the peak intensity of intensity curve 380 is about 3 ergs/cm$^2$.

Figure 4:
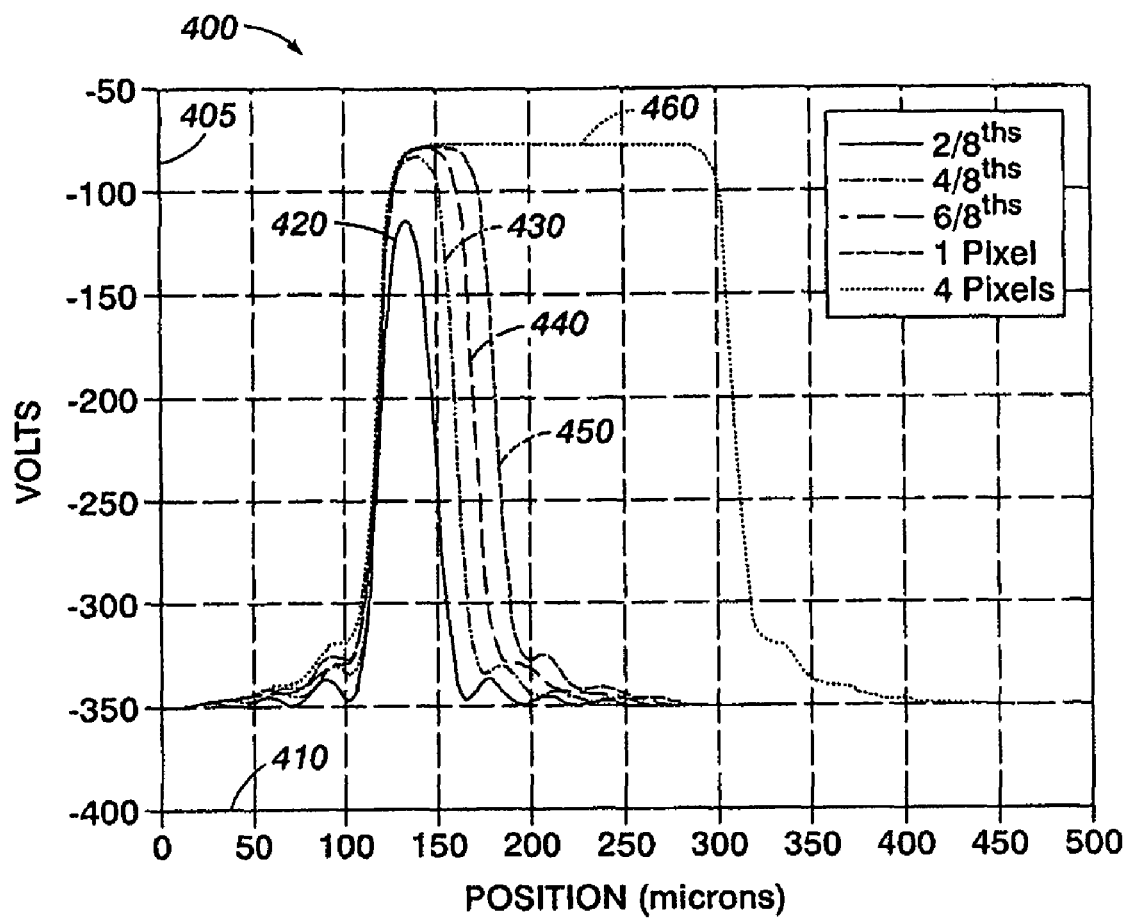
FIG. 4 shows exemplary latent image profiles corresponding to the exemplary dynamic spot profiles shown in FIG. 3.

FIG. 4 shows an exemplary latent image profile 400 corresponding to the dynamic spot profile of FIG. 3 plotted against voltage and pixel position. In particular, latent image profile 400 includes voltage curves 420-460 corresponding to intensity curves 340-380, respectively. Voltage curves 430-460, corresponding to intensity curves 350-380, produce desired peak discharge voltages of about −75 volts, while intensity curve 340 corresponding to $\frac{2}{8}^{th}$ subpixel produces a peak discharge voltage of about −120 volts, which is less than desired. Thus, the discharge voltage of an actual $\frac{2}{8}^{th}$ subpixel has a significantly lower discharge voltage and is underdeveloped. Consequently, the laser diode output used to generate curve 340 may be increased to increase the light intensity, creating an adequate integral value and thus better development of the $\frac{2}{8}^{th}$ subpixel.

Figure 5:
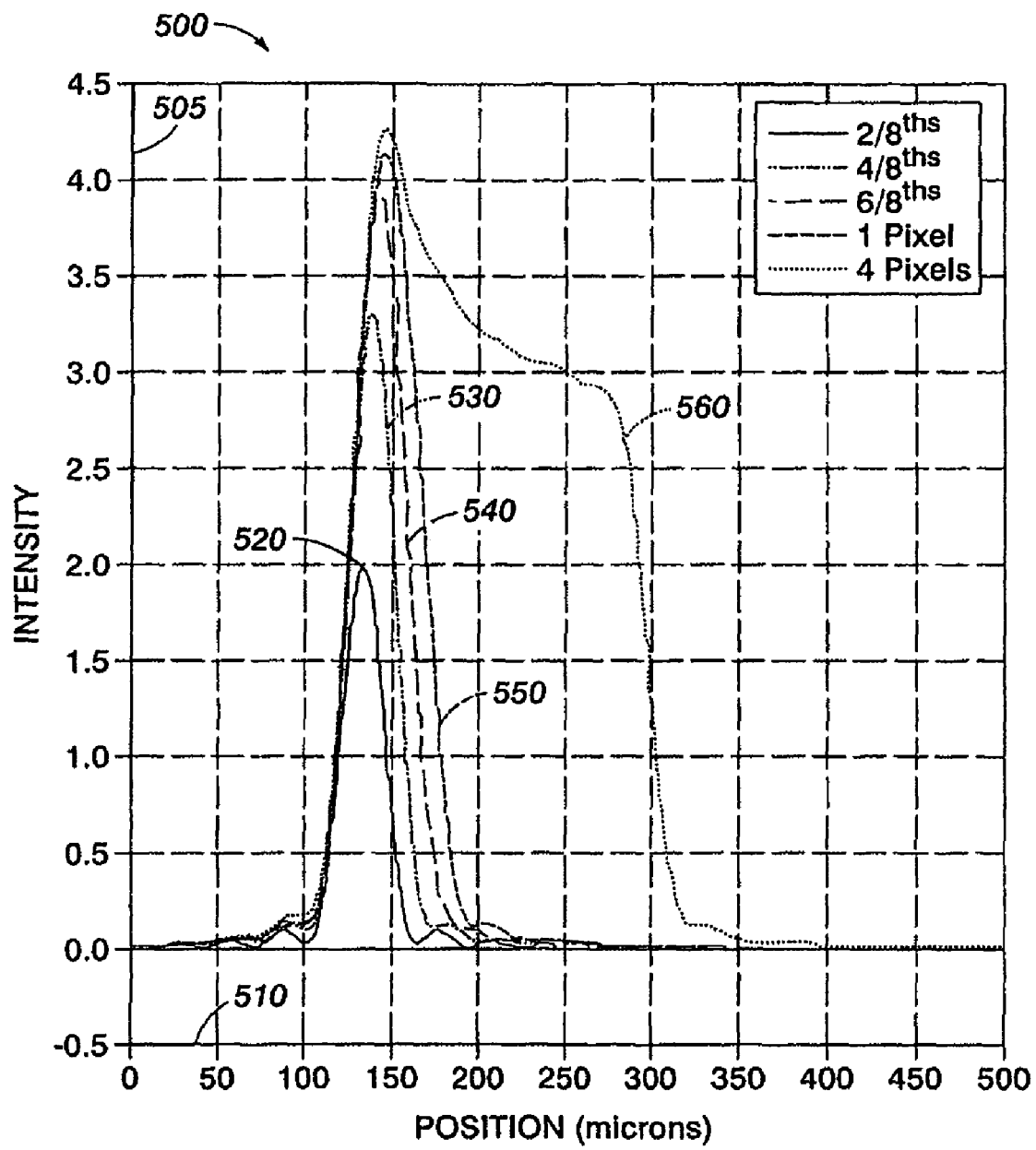
FIG. 5 shows exemplary dynamic spot profiles with overshoot.

FIG. 5 shows an exemplary dynamic spot profile 500 like the profile shown in FIG. 3 that includes an initial light intensity boost. Intensity curves 520-560 correspond to $\frac{2}{8}^{th}$, $\frac{4}{8}^{th}$, $\frac{6}{8}^{th}$, 1 pixel and 4 pixels intensity, respectively.

As shown in FIG. 5, intensity curves 520-560 have peak intensities which are higher than corresponding peak intensities of intensity curves 340-380. In particular, the peak intensity of intensity curve 520, corresponding to a subpixel with a $\frac{2}{8}^{th}$ pixel width, is about 2 ergs/cm$^2$, whereas the peak intensity of intensity curve 340 is about 1.05 ergs/cm$^2$. Furthermore, in comparison to intensity curve 340, the area below intensity curve 520 is about twice that of intensity curve 340.

Figure 6:
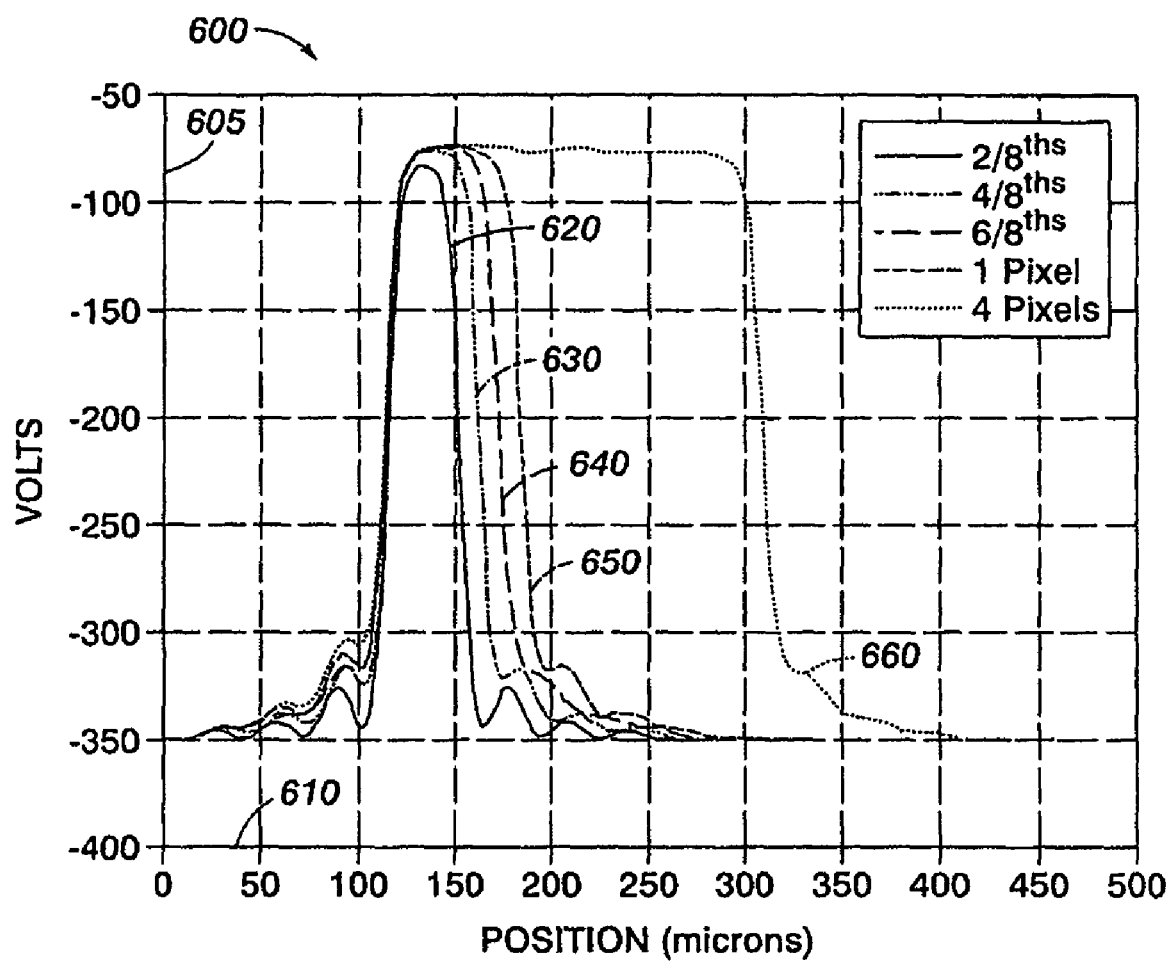
FIG. 6 shows exemplary latent image profiles with overshoot corresponding to the exemplary dynamic spot profiles shown in FIG. 5.

FIG. 6 shows an exemplary latent image profile 600 corresponding to dynamic spot profile 500. Voltage curves 620-660 correspond to the intensity curves 520-560, respectively. Voltage curve 620 has a discharge voltage peak of about −80 volts, which is substantially the same as the desired discharge voltage peaks of about −75 volts achieved by voltage curves 630-660. Furthermore, unlike the intensity curve 340, the intensity curve 520 encompasses a larger area and therefore provides a discharge voltage curve that achieves better development of the $\frac{2}{8}^{th}$ subpixel.

Peak light intensities of intensity curves 530-560 are above the steady state light intensity of about 2.8 ergs/cm2. This "overshoot" light above 2.8 ergs/cm2 may not result in an undesirable development because of a saturation characteristic of certain photoreceptors. Thus, providing a light intensity boost at an initial light emission period of the laser diode achieves better development of subpixels, but the corresponding overshoot does not result in any adverse effects on the image writing process.

Figure 7:
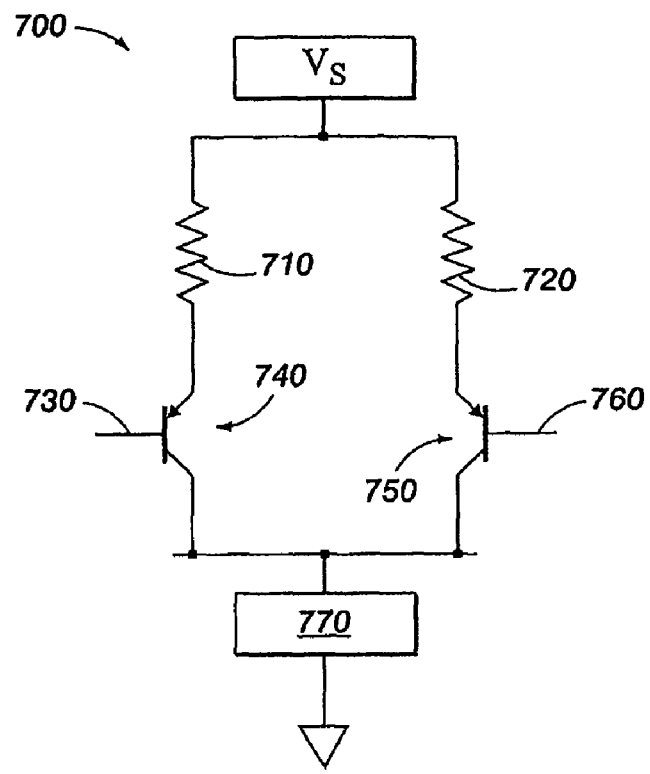
FIG. 7 shows an exemplary laser diode drive circuit without overshoot.

FIG. 7 shows an exemplary laser diode driver circuit 700 that includes voltage source Vs, drive resistor 710 and bias resistor 720, input data terminal 730, drive transistors 740 and bias transistor 750, voltage bias terminal 760, and laser diode 770. Bias transistor 750, voltage bias terminal 760 and bias resistor 720 may be included in a biasing portion of driver circuit 700, for example. Laser diode 770 may implement laser 170 discussed above and emit laser beam 175, for example. While FIG. 7 shows PNP transistors 740 and 750, other types of transistors may be used depending on specific application requirements.

Voltage bias terminal 760 may receive a bias voltage that maintains laser diode 770 just below a lasing threshold. In this way, any delay time needed for laser diode 770 to begin lasing may be minimized.

Additionally drive resistor 710 and bias resistor 720 may have (or be set to) values that reflect desirable intensities of laser beam 175, for example. Laser diode 770 may be driven to emit a range of light intensities. In addition to achieving a more desired print quality, selecting a desired light intensity of laser beam 175 may also involve considerations of other parameters such as laser life time, power consumption, heat dissipation, etc. Thus, values of drive resistor 710 and bias resistor 720 may be set to obtain a light intensity that balances print quality, laser life time, power consumption, heat dissipation, etc.

As noted above, input data may be a stream of bits corresponding to a sequence of consecutive pixels (or subpixels). The input data may be received by driver circuit 700 at input data terminal 730 as either a high voltage or a low voltage turning drive transistor 740 off (1) or on (0), respectively. When off, drive transistor 740 disconnects laser diode 770 from Vs, thus turning laser diode 770 off. When on, drive transistor 740 connects laser diode 770 to Vs, thus turning laser diode 770 on.

When a 0 (corresponding to either a pixel or a subpixel) is received at input data terminal 730, drive transistor 740 turns on, and laser beam 175 transitions from substantially 0 intensity towards a desired intensity. While laser beam 175 is transitioning, polygonal mirror 190 continues to rotate at a predetermined rate so that a subpixel distance is traversed. If only a single subpixel is written, a 0 is received next at input data terminal 730 for the subsequent subpixel and drive transistor 740 turns off causing the intensity of laser beam 175 to transition from whatever intensity value that was reached by the prior transition to substantially 0 intensity. The intensity profile of laser beam 175 may be represented by intensity curve 340 as shown in FIG. 3.

As noted above, photoreceptor 198 responds to the transitioning laser beam 175 by integrating the light intensity profile. Thus, the net effect on photoreceptor 198 corresponds to the area under curve 340. As shown in FIG. 4, the result of this integration is voltage curve 420 that, at its peak, reaches about −120 volts, and may not encompass sufficient area to create a more desired printer output, such as a printer output of a narrow width serif, for example.

This insufficient development may be overcome by increasing a light intensity integration value within an initial subpixel time period. As noted above, the light intensity at photoreceptor 190 may be less than desired during the initial subpixel time period. Thus, laser diode 770 may be driven to output light at a greater intensity during the initial transition period so that an integral of the light intensity during the initial subpixel period may be increased to improve subpixel development at the photoreceptor 198, for example.

Figure 8:
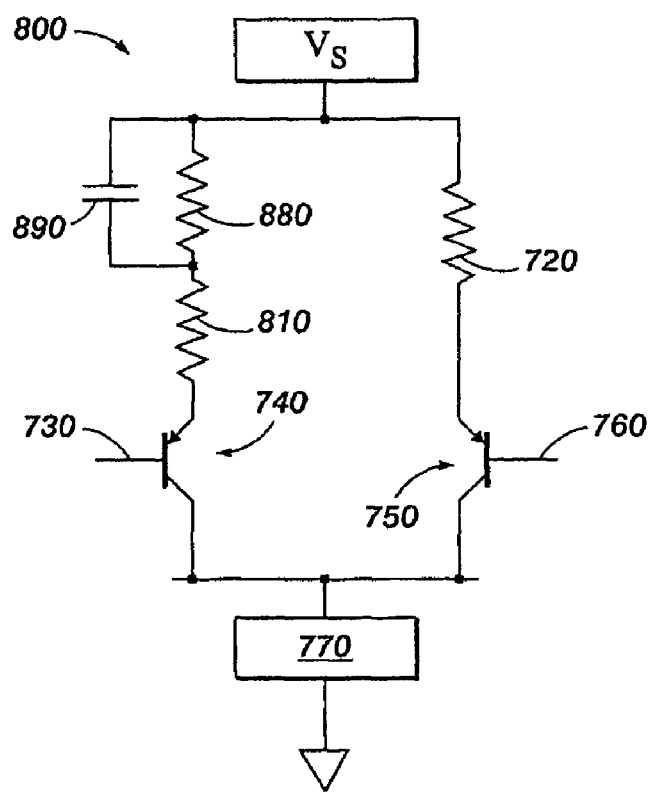
FIG. 8 shows a first exemplary laser diode drive circuit with overshoot.

FIG. 8 shows an exemplary laser diode driver circuit 800, which may be a controller that increases an initial intensity of laser beam 175 by boosting an initial driving current to generate intensity curves, such as intensity curve 520-560 depicted in FIG. 5, for example. With the exception of resistor 710, driver circuit 800 is identical to driver circuit 700 shown in FIG. 7. In particular, drive resistor 710 is replaced by boost resistor 880, drive resistor 810 and a boost capacitor 890 connected across boost resistor 880. A sum of boost resistor 880 and drive resistor 810 may be substantially the same as the value of drive resistor 710. The ratio of the resistances of boost resistor 880 and drive resistor 810 maybe set based on the desired intensity boost. Boost capacitor 890 and boost resistor 880 and drive resistor 810 form an RC network having a time constant. The time constant may be set to obtain the desired integrated intensity over an initial subpixel.

Boost capacitor 890 may be included in a boost portion, for example. Similarly, drive resistor 810, drive transistor 740, and input data terminal 730 may be included in a steady state portion, for example. The node between drive resistor 810 and drive transistor 740 may be a first power terminal, the node connecting input data terminal 730 to drive transistor 740 may be a control terminal, and the node between transistor 740 and laser diode 770 may be a second power terminal, for example.

When a 1 is received at input data terminal 730, drive transistor 740 turns on. Unlike driver circuit 700, the initial current flowing toward laser 170 is greater than that set by drive resistor 710 because boost capacitor 890 effectively shunts boost resistor 880 so that drive resistor 810 having a value lower than drive resistor 710 determines the initial current. Based on Ohm's law, the current is inversely proportional to the resistance value in a constant voltage condition. Thus, the initial current flowing to laser diode 770 in driver circuit 800 is greater than the initial current flowing to laser diode 770 in driver circuit 700.

The initial current flows substantially from boost capacitor 890 because the voltage across boost resistor 880 is initially 0. As the voltage across capacitor 890 increases due to the initial current flow, current flow becomes increasingly set by the series resistance of boost resistor 880 and drive resistor 810. After several RC time constants (substantially steady state condition), the current flow to laser diode 770 is substantially set by resistors 880 and 810 and current flowing from boost capacitor 890 is substantially 0.

As discussed above, the increased intensity in laser beam 175 may not adversely affect print quality due to saturation qualities of photoreceptor 198. If steady state intensity of laser beam intensity 175 is substantially at the saturation value of photoreceptor 198, further increase in intensity does not substantially affect a response of photoreceptor 198. Any increase of the intensity of laser beam 175 above a steady state value would not cause an over-development effect. Thus, increasing the initial intensity of laser beam 175 improves initial subpixel performance without adversely affecting other steady state performance.

Techniques other than the above-described exemplary driver circuit 800 may be applied to increase initial intensity of laser beam 175. For example, instead of replacing resistor drive 710 with boost resistor 880, drive resistor 810 and boost capacitor 890, an additional boost portion similar to a driving portion containing resistor 710 and transistor 740 may be added to increase current flow during an initial subpixel period.

Figure 9:
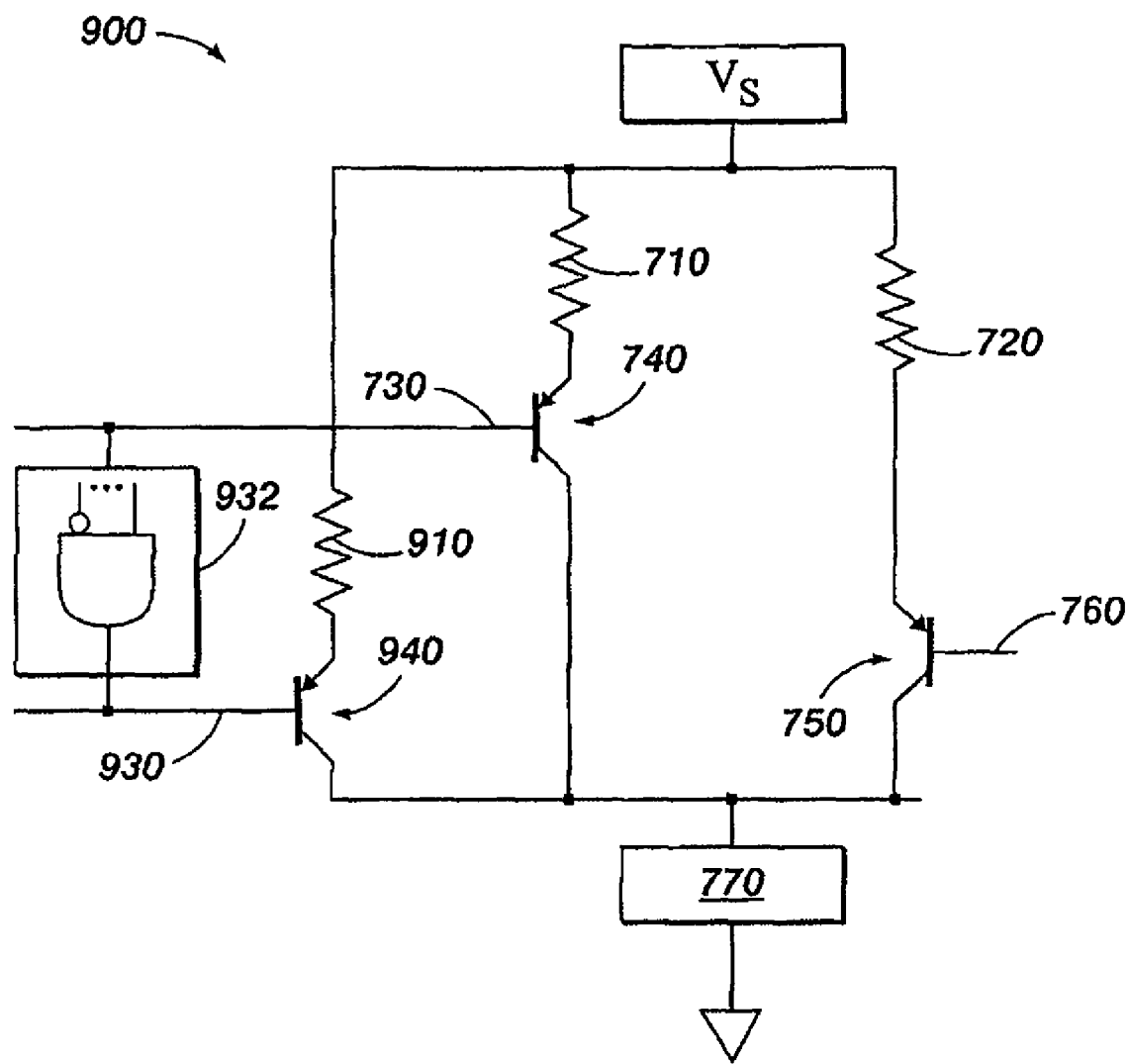
FIG. 9 shows a second exemplary laser diode drive circuit with overshoot.

As shown in FIG. 9, driver circuit 900 may include boost transistor 940 and boost resistor 910 in addition to the components of driver circuit 700. An input data terminal 930 may receive a control signal from a boost controller 932 that turns boost transistor 940 on when additional driving current is needed to increase intensity. The controller may simply be a 0 to 1 transition detector such as a two input AND gate with one of the inputs inverted, where the inputs of the AND gate are connected to the input and output of a delay circuit, for example. Such a detector may detect a 01 pattern where a 0 input bit occurs immediately before a 1 input bit. If the duration of the boost should be a longer duration, then boost transistor 940 may be kept on by using a parallel connected capacitor and a resistor connected between the base of boost transistor 940 and ground, for example. In this way, a 0 to 1 transition may receive a boost current to increase intensity without expending unnecessary power during other input data patterns. Both the boost resistor and boost transistor may be included in a boost portion, for example.

While driver circuit 900 obtains the increased driving current by using a hardware technique to detect a 0 to 1 transition of the input data, transistor 940 may be controlled by software to achieve substantially the same result. For example, instead of boost controller 932, input data terminal 930 may receive control data from a control line. Control data that drives the control line may be determined by software executing in hardware such as CPU 120, for example, based on the input data. In particular, input data may be processed by software to determine the 0 to 1 transitions and control data may be generated to turn on boost transistor 940 for a desired duration.

Figure 10:
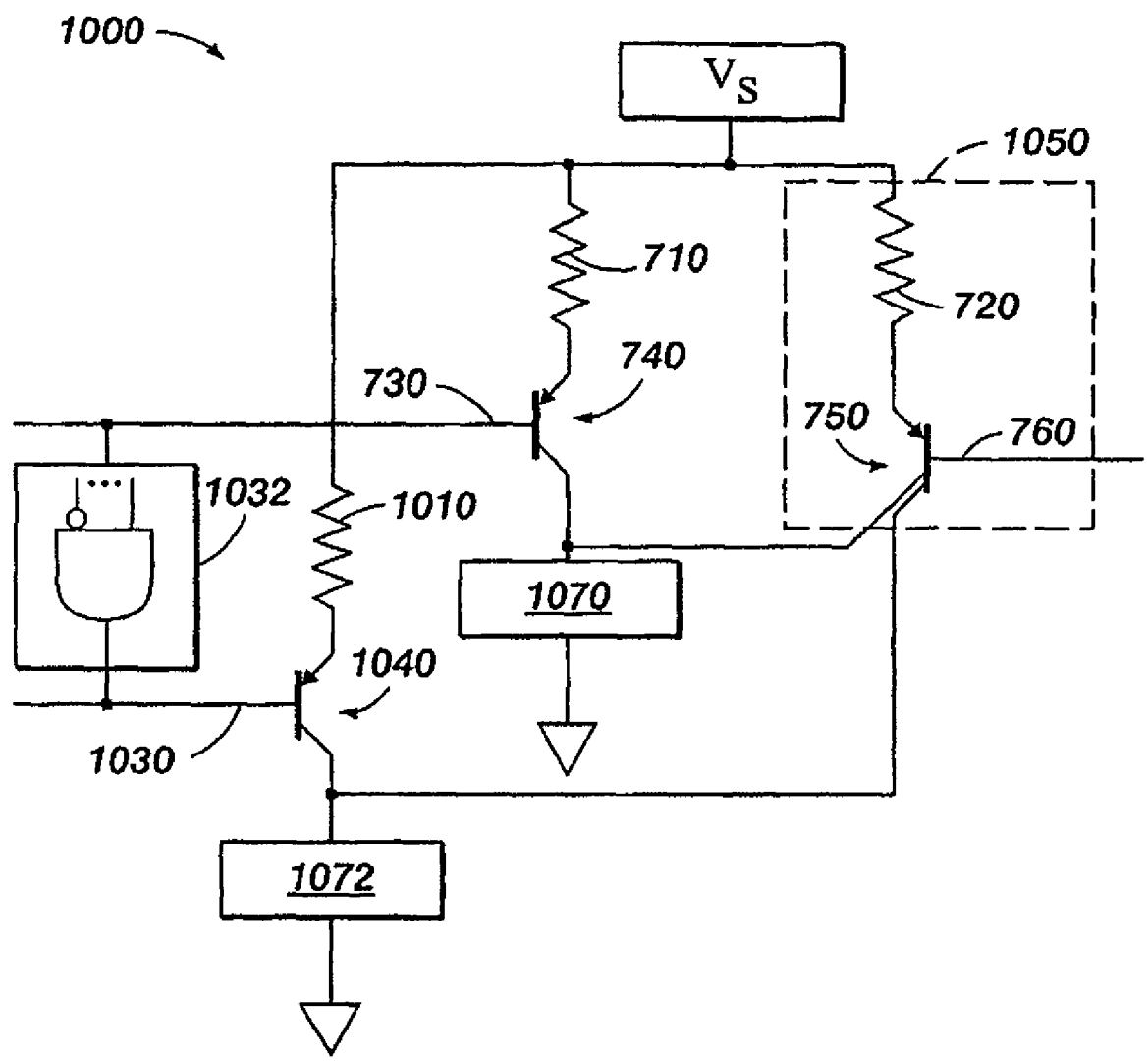
FIG. 10 shows a third exemplary laser diode drive circuit with overshoot.

FIG. 10 shows a further exemplary driver circuit 1000 for increasing initial transition intensity. Driver circuit 1000 includes multiple light emitting devices such as laser diodes 1070 and 1072 to generate laser beam 175. Bias current portion 1050 may includes bias transistor 750 and bias resistor 720 of driver circuit 700 and provide biasing current for laser diodes 1070 and 1072. Transistor 740 and resistor 710 provide driving current to laser diode 1070, and boost transistor 1040 and boost resistor 1010 provide additional current to cause laser diode 1072 to lase.

Input data terminal 730 receives the input data for printing, for example, and input data terminal 1030 receives a control signal to turn on boost transistor 1040 which turns on laser diode 1072 to increase the intensity of laser beam 175. A boost controller 1032 may be provided as in driver circuit 900 to detect a 0 to 1 transition and generate the control signal and, as discussed above, a further circuit such as an RC circuit may also be provided to extend the additional intensity for a desired period. As also discussed above, instead of controller 1032, input data terminal 1030 may be driven by software via a control signal.

Figure 11:
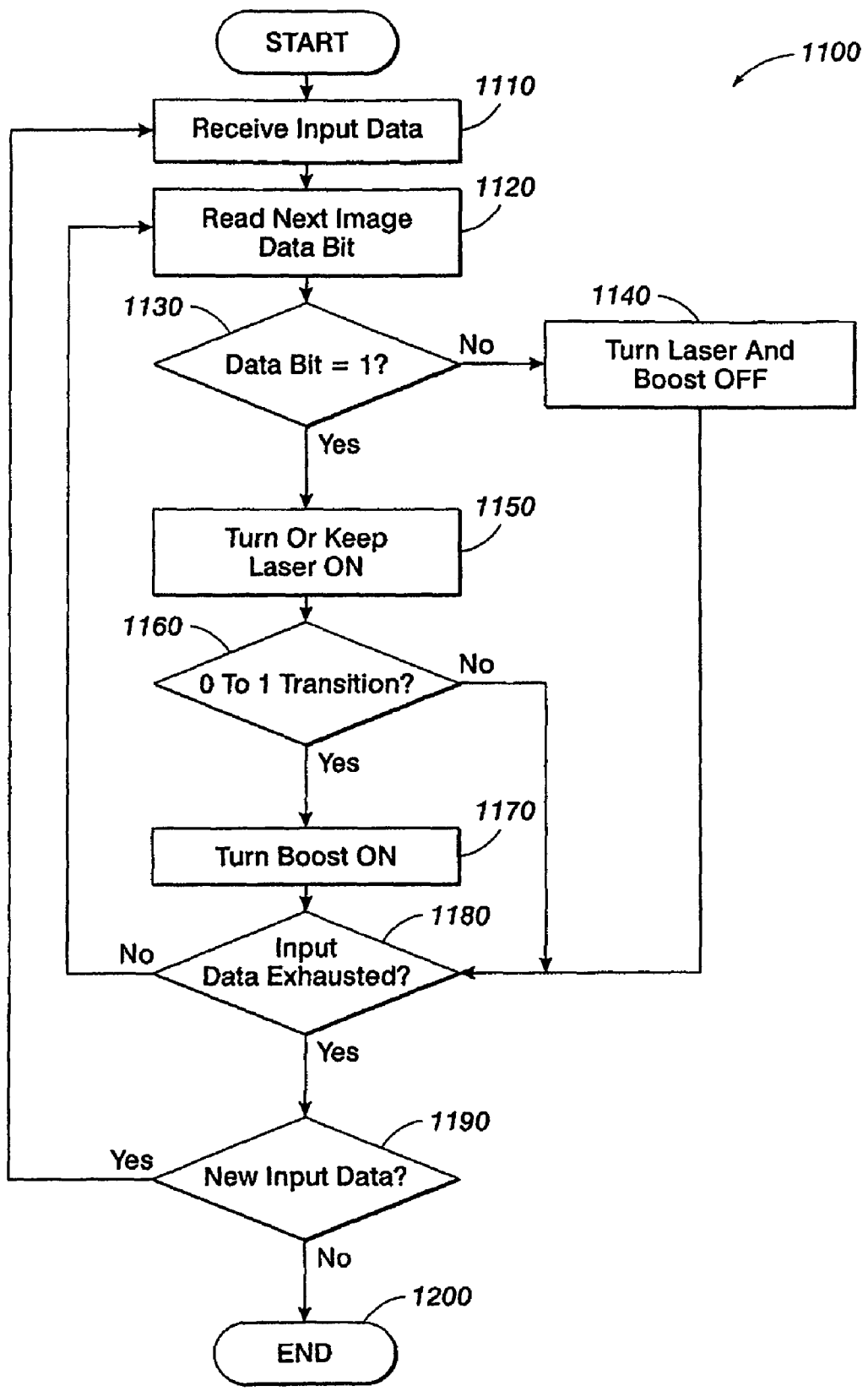
FIG. 11 shows an exemplary flow chart.

FIG. 11 shows a flow chart for an exemplary process 1100 for boosting light intensity, as described above, for example. After starting, the process goes to step 1110. In step 1110, the process receives input data, and goes to step 1120. The input data may be received from a source such as a scanner or a memory, for example. In step 1120, the process reads a next input data bit from the input data received in step 1110, and goes to step 1130.

In step 1130, the process determines whether the next input data bit is a 1 or not. If the bit is a 1, the process goes to step 1150; otherwise, the process goes to step 1140. In step 1150, the process turns on or keeps on laser 170, and goes to step 1160. In step 1140, the process turns off laser 170 and boost if on as described above with respect to FIGS. 8-10, for example, and goes to step 1180.

In step 1160, the process determines whether there is a 0 to 1 transition in the input data. For example, laser printer system 100 may contain a memory such as a flip flop which stores the value of the previously read bit. Thus, laser printer system 100 may determine whether this previously read bit stored in memory is a 0 and the currently read bit is a 1 to determine a 0 to 1 transition. If a 0 to 1 transition is detected, the process goes to step 1170; otherwise the process goes to step 1180 In step 1170, the process turns on a boost for a predetermined period and goes to step 1180.

In step 1180, the process determines whether the input data has been exhausted. If exhausted, the process goes to step 1190; otherwise the process returns to step 1120 to read a next input data bit. In step 1190, the determines whether new data is ready for processing. If new data is ready, the process returns to step 1110; otherwise, the process goes to step 1200 and ends.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A laser beam control device provided in a printer, the laser beam control device comprising:
   a light emitting device; and
   a controller that controls the light emitting device to emit light of greater intensity in an initial time period than in other time periods, the controller controlling the intensity of light emitted by the light emitting device based on a size of a pixel to be written.

2. The device of claim 1, further comprising:
   an input data terminal that receives input data, the controller processing the input data to determine the initial time period and controlling the light emitting device differently during the initial time period than during the other time periods.

3. The device of claim 2, wherein the controller is a light emitting device driver circuit, the driver circuit includes a biasing portion and a driving portion, the driving portion driving the light emitting device with more power during the initial time period than during the other time periods.

4. The device of claim 3, wherein the driver circuit is configured so that the initial time period begins at the start of a light emission.

5. The device of claim 3, wherein the driver circuit comprises:
   a steady-state portion; and
   a boost portion, distinct from the steady-state portion, wherein
   the driver circuit is configured so that the boost portion provides an intensity boost to a light emission of the light emitting device during the initial time period.

6. The device of claim 5, wherein the steady-state portion comprises:
   a drive resistor; and
   a drive transistor connected to the drive resistor, the drive transistor including a first power terminal, a second power terminal, and a control terminal, the drive resistor being connected to the first power terminal of the drive transistor.

7. The device of claim 6, wherein the boost portion comprises:
   a boost resistor connected to the drive resistor; and
   a capacitor connected in parallel with the boost resistor.

8. The device of claim 6, wherein the boost portion comprises:
   a boost resistor; and
   a boost transistor, the boost transistor including a first power terminal, a second power terminal, and a control terminal, the boost resistor being connected to the first power terminal of the boost transistor.

9. The device of claim 8, wherein the second power terminals of the drive and boost transistors are both connected to a same light source of the light emitting device.

10. The device of claim 8, wherein the light emitting device includes at least two light sources, the second power terminals of the drive and boost transistors are connected to different ones of the light sources.

11. The device of claim 8, wherein
    the boost portion further comprises a boost controller, the boost controller activates the boost portion during the initial time period.

12. The device of claim 11, wherein the boost controller comprises:
    a leading edge detector that detects an off-on transition in the input data, the boost controller activates the boost portion when the off-on transition is detected.

13. The device of claim 12, wherein the leading edge detector comprises:
    a first delay circuit;
    an AND gate; and
    an inverter connected to a first input of the AND gate, wherein an input of the inverter is connected to an input of the delay circuit and a second input of the AND gate is connected to an output of the delay circuit.

14. A method for writing a xerographic image with a printer, the method comprising
    emitting a light at a first intensity during an initial time period; and
    emitting the light at a second intensity during other time periods, the first intensity being greater than the second intensity, the intensity of light being emitted based on a size of a pixel to be written.

15. The method of claim 14, further comprising:
    inputting input data for the xerographic image;
    processing the input data to determine the initial time period; and
    driving a light emitting device to emit the first intensity during the initial time period.

16. The method of claim 15, the processing comprising:
    driving the light emitting device with a first power during the initial time period; and
    driving the light emitting device with a second power that is less than the first power during the other time periods, the initial time period being determined by an RC circuit.

17. The method of claim 15, the processing comprising:
    analyzing the input data to determine light emitting device on-off transitions; and
    driving the light emitting device to emit the first and second intensities based on the on-off transitions, wherein the first and second intensities are obtained by one or more of:
    increasing a power that drives a single light source of the light emitting device for the first intensity to be greater than a second power for the second intensity; and
    driving a greater number of light sources for the first intensity than for the second intensity.

18. A printer device comprising:
  means for emitting a light beam; and
  means for controlling the means for emitting the light beam to emit light of greater intensity in an initial time period than in other time periods, and to emit the intensity of light based on a size of a pixel to be written.

19. The printer device of claim 18, wherein the means for controlling comprises:
  means for driving the means for emitting the light beam; and means for boosting the means for emitting the light beam to obtain greater light intensity than provided by the means for driving.

* * * * *